(12) United States Patent
Lowe (10) Patent No.: US 11,275,401 B2
(45) Date of Patent: Mar. 15, 2022

(54) TAMPER MONITORING CIRCUITRY

(71) Applicant: Arm Limited, Cambridge (GB)

(72) Inventor: Ivan Michael Lowe, Austin, TX (US)

(73) Assignee: Arm Limited, Cambridge (GB)

( * ) Notice: Subject to any disclaimer, the term of this patent is extended or adjusted under 35 U.S.C. 154(b) by 234 days.

(21) Appl. No.: 16/743,585

(22) Filed: Jan. 15, 2020

(65) Prior Publication Data

US 2021/0216096 A1 Jul. 15, 2021

(51) Int. Cl.
| | |
|---|---|
| *G06F 1/10* | (2006.01) |
| *H03K 5/125* | (2006.01) |
| *H03K 19/20* | (2006.01) |
| *G01R 29/02* | (2006.01) |
| *G08B 29/08* | (2006.01) |
| *H03K 3/037* | (2006.01) |
| *H03K 5/00* | (2006.01) |

(52) U.S. Cl.
CPC ............. *G06F 1/10* (2013.01); *G01R 29/023* (2013.01); *G08B 29/08* (2013.01); *H03K 3/037* (2013.01); *H03K 5/125* (2013.01); *H03K 19/20* (2013.01); *H03K 2005/00078* (2013.01)

(58) Field of Classification Search
CPC ......... G06F 1/10; G01R 29/023; G08B 29/08; H03K 3/037; H03K 5/125; H03K 19/20; H03K 2005/00078
USPC .......................................... 340/512
See application file for complete search history.

(56) References Cited

U.S. PATENT DOCUMENTS

| | | | | |
|---|---|---|---|---|
| 5,554,946 | A * | 9/1996 | Curran | G11C 7/1072 327/152 |
| 7,030,675 | B1 * | 4/2006 | Wang | H03K 5/1252 327/262 |
| 8,773,185 | B2 * | 7/2014 | Subramanian | H03L 7/0812 327/158 |
| 9,071,446 | B2 * | 6/2015 | Kreft | H04L 63/0823 |

\* cited by examiner

*Primary Examiner* — Eric Blount
(74) *Attorney, Agent, or Firm* — Pramudji Law Group PLLC; Ari Pramudji (57) ABSTRACT

Various implementations described herein are directed to a device having alarm circuitry that receives a clock signal and provides alarm chain signals based on the clock signal. The device may include delay chain circuitry that receives the alarm chain signals from the alarm circuitry and provides delay chain signals. The device may include output circuitry that receives the delay chain signals from the delay chain circuitry and provides an alarm control signal based on the delay chain signals.

20 Claims, 5 Drawing Sheets

TAMPER MONITORING CIRCUITRY

BACKGROUND

This section is intended to provide information relevant to understanding the various technologies described herein. As the section's title implies, this is a discussion of related art that should in no way imply that it is prior art. Generally, related art may or may not be considered prior art. It should therefore be understood that any statement in this section should be read in this light, and not as any admission of prior art.

Tamper resistant circuits refer to various methodologies that are used to inhibit, impede and/or detect unapproved access to a device or unauthorized bypass of security logic. Since some devices or computing systems can be unlawfully accessed by persons having sufficient knowledge, equipment, time, etc., a tamper resistant methodology may refer to some resistance to tampering by normal users having physical access to a circuit, device and/or system. In some situations, tamper resistance may refer to simple features, such as anti-tampering devices in specialized drives, or to sophisticated devices that are rendered inoperable with tampering. Thus, in modern industrial applications, there exists a persistent need for anti-tampering measures in circuits, devices and/or systems.

BRIEF DESCRIPTION OF THE DRAWINGS

Implementations of various techniques are described herein with reference to the accompanying drawings. It should be understood, however, that the accompanying drawings illustrate only various implementations described herein and are not meant to limit embodiments of various techniques described herein.

DETAILED DESCRIPTION

Various implementations described herein are directed to tamper monitoring schemes and techniques that provide for oscillator-free tamper monitoring through a delay chain in various physical memory layout designs. For instance, various tamper monitoring schemes and techniques described herein may provide for a system or device having a unique delay chain architecture that detects edge movement or glitch on an input clock signal, without use of a ring oscillator. Rather than counting edges of a fast ring oscillator during a clock pulse, the various tamper monitoring schemes and techniques described herein determine the pulse width by resetting (or not resetting) individual bits of a register using a delay chain. In this instance, the clock pulse is fed into the delay chain, and then each point in the delay chain is logical ANDed so as to provide (or not provide) a variable width pulse that drives an asynchronous reset pin of a register (e.g., D-flip-flop).

In some instances, the various schemes and techniques described herein may provide for a system or device having a multi-stage tamper monitoring architecture that is configured to detect edge movement or glitch associated with the pulse width of the input clock signal in various physical memory layout designs. As described herein, the multi-stage architecture of the tamper monitoring circuitry may be configured to determine the pulse width of the input clock signal and detect edge movement or glitch associated with the pulse width of the input clock signal. In this instance, receiving the input clock signal at reset pins of registers (or flip-flops) in a register chain may provide for an asynchronous reflection of the clock pulse width of the input clock signal.

Various implementations of tamper monitoring schemes and techniques will be described in detail herein with reference to FIGS. 1-5.

Figure 1:
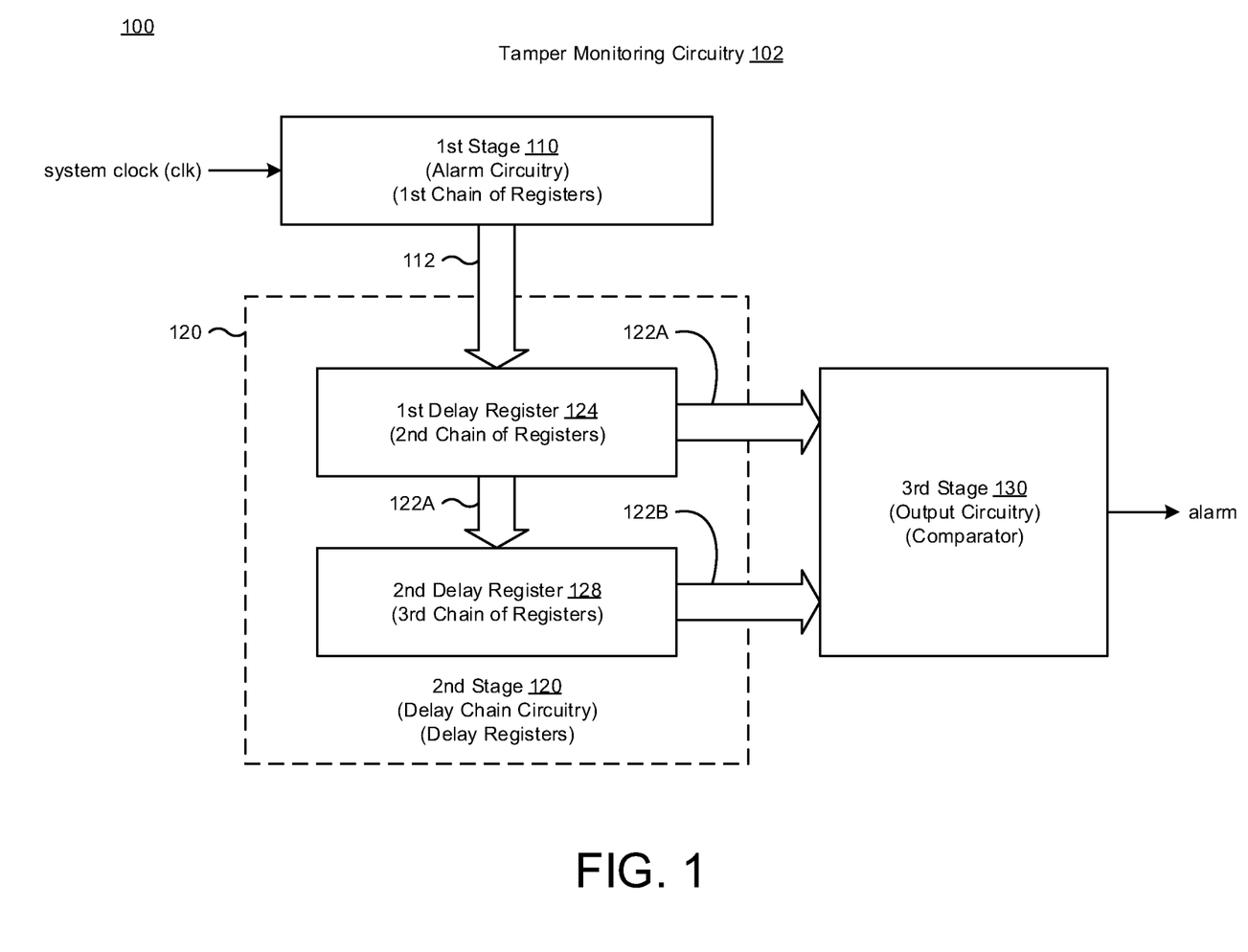
FIG. 1 illustrates a diagram of tamper monitoring circuitry in accordance with various implementations described herein.

FIG. 1 illustrates a schematic diagram 100 of tamper monitoring circuitry 102 in accordance with various implementations described herein.

In various instances, the tamper monitoring circuitry 102 may be implemented as a system or device having various integrated circuit (IC) components that are arranged and coupled together as an assemblage or combination of parts that provide for a physical circuit design and related structures. In some instances, a method of designing, providing and building the tamper monitoring circuitry 102 as an integrated system or device may involve use of various IC circuit components described herein so as to thereby implement tamper monitoring schemes and techniques associated therewith. The tamper monitoring circuitry 102 may be integrated with various computing circuitry and related components on a single chip, and the tamper monitoring circuitry 102 may be implemented in various embedded systems for electronic, mobile and Internet-of-things (IoT) applications.

As shown in FIG. 1, the tamper monitoring circuitry 102 may include a first stage 110 having alarm circuitry that receives a clock signal (clk) and provides alarm chain signals 112 based on the clock signal (clk). The alarm chain signals 112 may refer to first delay chain signals, and the alarm circuitry may include a first chain of registers that are configured to receive the clock signal (clk) and provide the first delay chain signals 112 based on the clock signal (clk). The alarm circuitry may include a chain of logic gates that are coupled to the first chain of registers, and the chain of logic gates may receive the clock signal (clk) and provide a delayed clock signal to a reset pin of each register in the first chain of registers. In some instances, each register in the first chain of registers may receive the clock signal (clk) at a reset pin, receive a data signal at a data input pin, and separately provide a first delay chain signal of the first delay chain signals 112 based on the clock signal (clk) and the data signal. Also, each register in the first chain of registers may be configured to operate as a D-flop-flop, and the clock signal (clk) may refer to a system clock, and the data signal may refer to a logic high signal. In some instances, the tamper monitoring circuitry 102 may be configured as a device that determines the pulse width of the clock signal (clk) and that detects edge movement or glitch associated with the pulse width of the clock signal (clk). These features along with various other features, characteristics, and behaviors associated with the first stage 110 are described in greater detail herein in reference to FIG. 2.

The tamper monitoring circuitry 102 may include a second stage 120 having delay chain circuitry 124, 128 that receives the alarm chain signals 112 from the alarm circuitry of the first stage 110 and provides delay chain signals 122A, 122B. The delay chain signals 122A, 122B may refer to second delay chain signals 122A and third delay chain signals 122B, and the delay chain circuitry 124, 128 may include a first delay register 124 having a second chain of registers coupled to a second delay register 128 having a third chain of registers. In some instances, the second chain of registers in the first delay register 124 may be configured to receive the first delay chain signals 112 from the alarm circuitry of the first stage 110 and provide the second delay chain signals 122A of the delay chain signals 122A, 122B. Also, the third chain of registers in the second delay register 128 may be configured to receive the second delay chain signals 122A from the second chain of registers in the first delay register 124 and provide third delay chain signals 122B of the delay chain signals 122A, 122B. These features along with various other features, characteristics, and behaviors associated with the second stage 120 are described in greater detail herein in reference to FIG. 3.

The tamper monitoring circuitry 102 may include a third stage 130 having output circuitry that receives the delay chain signals 122A, 122B from the delay chain circuitry of the second stage 120 and provides an alarm control signal (alarm) based on the delay chain signals 122A, 122B. In some instances, the output circuitry of the third stage 130 may include one or more logic gates that are configured to receive the second delay chain signals 122A from the second chain of registers in the first delay register 124, receive the third delay chain signals 112B from the third chain of registers in the second delay register 128, and provide the alarm control signal (alarm) based on the second delay chain signals 122A and the third delay chain signals 122B. These features along with various other features, characteristics, and behaviors associated with the third stage 130 are described in greater detail herein in reference to FIG. 4.

Figure 2:
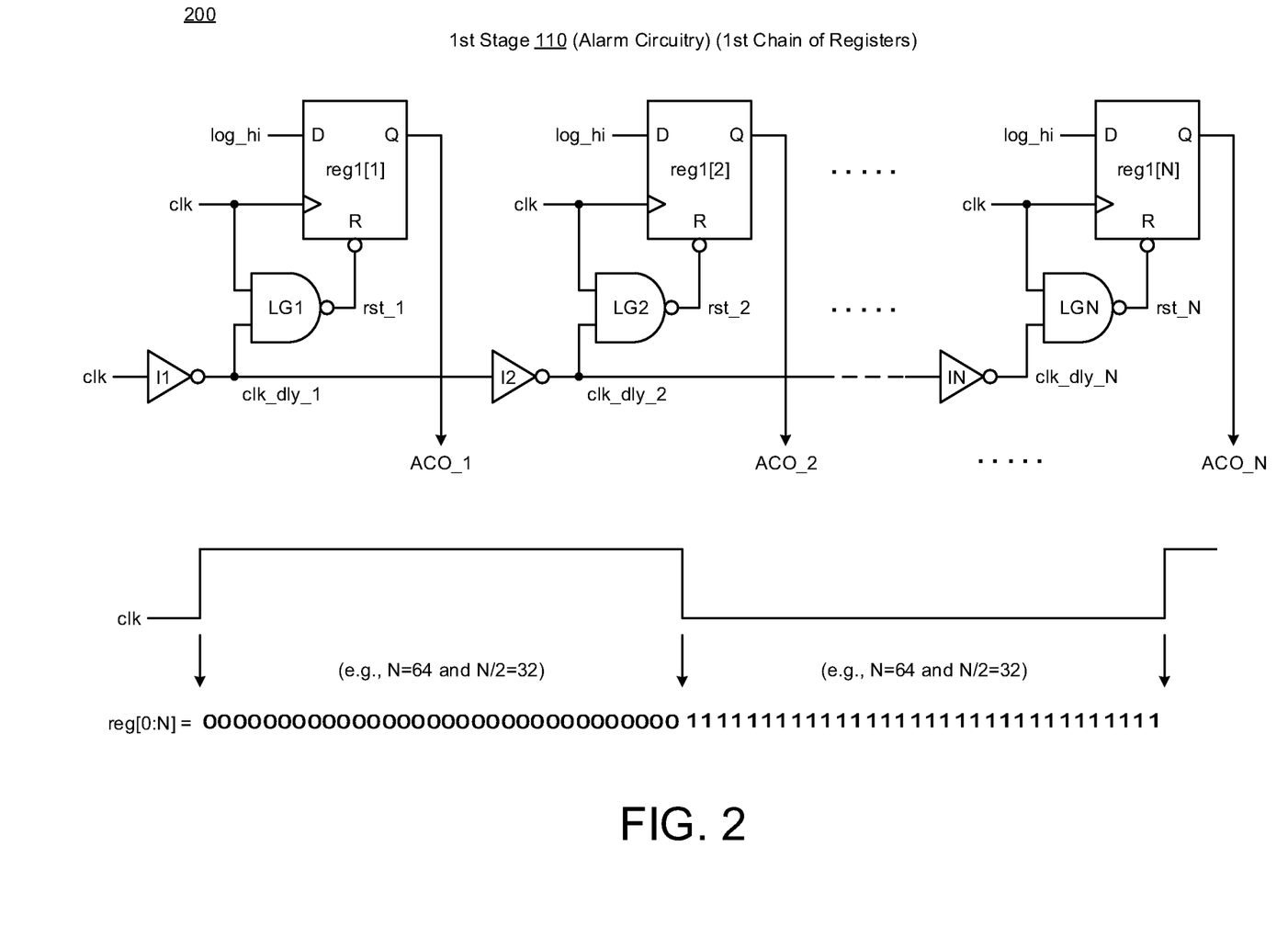
FIG. 2 illustrates a diagram of a first stage of tamper monitoring circuitry in accordance with various implementations described herein.
Figure 3:
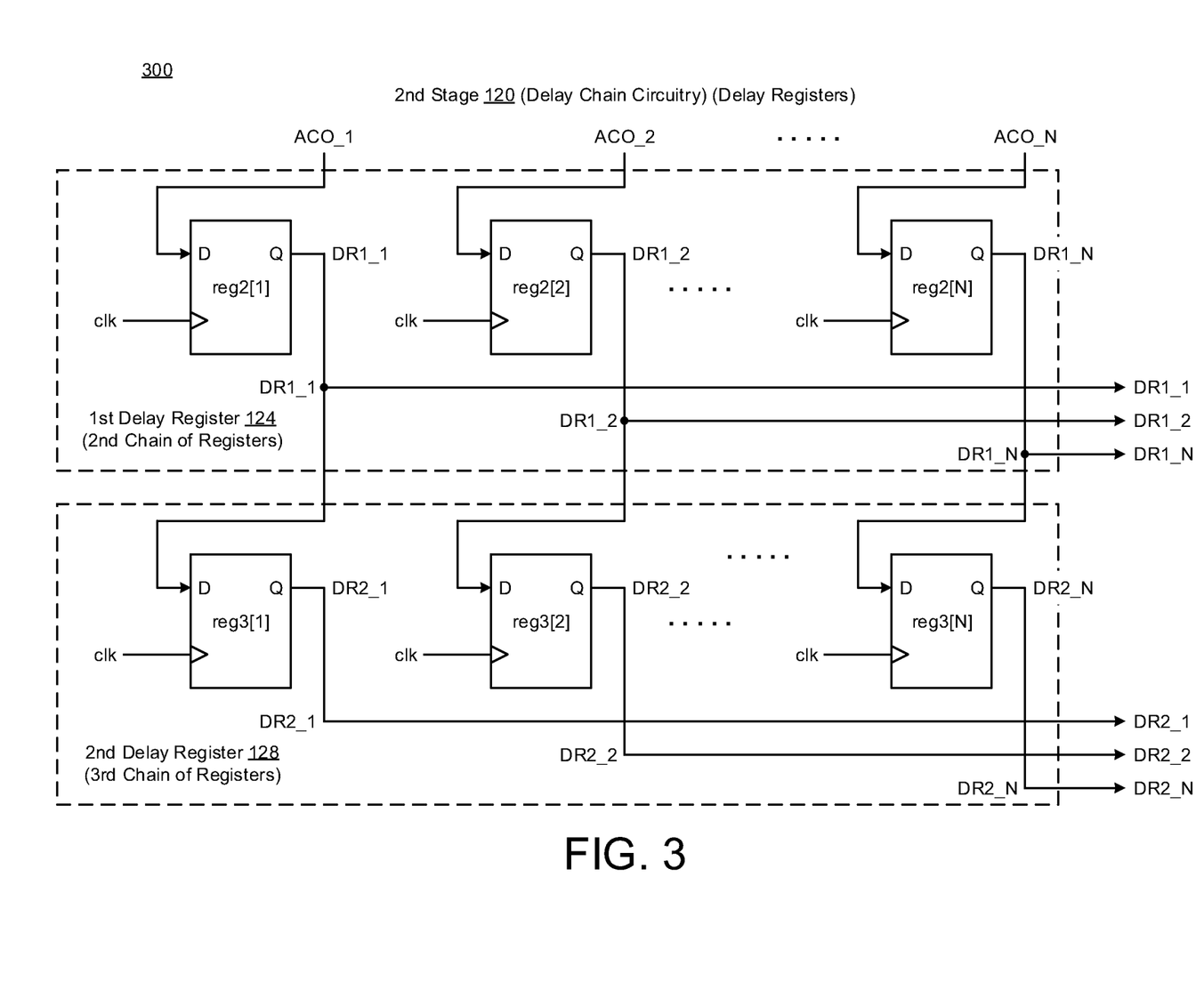
FIG. 3 illustrates a diagram of a second stage of tamper monitoring circuitry in accordance with various implementations described herein.
Figure 4:
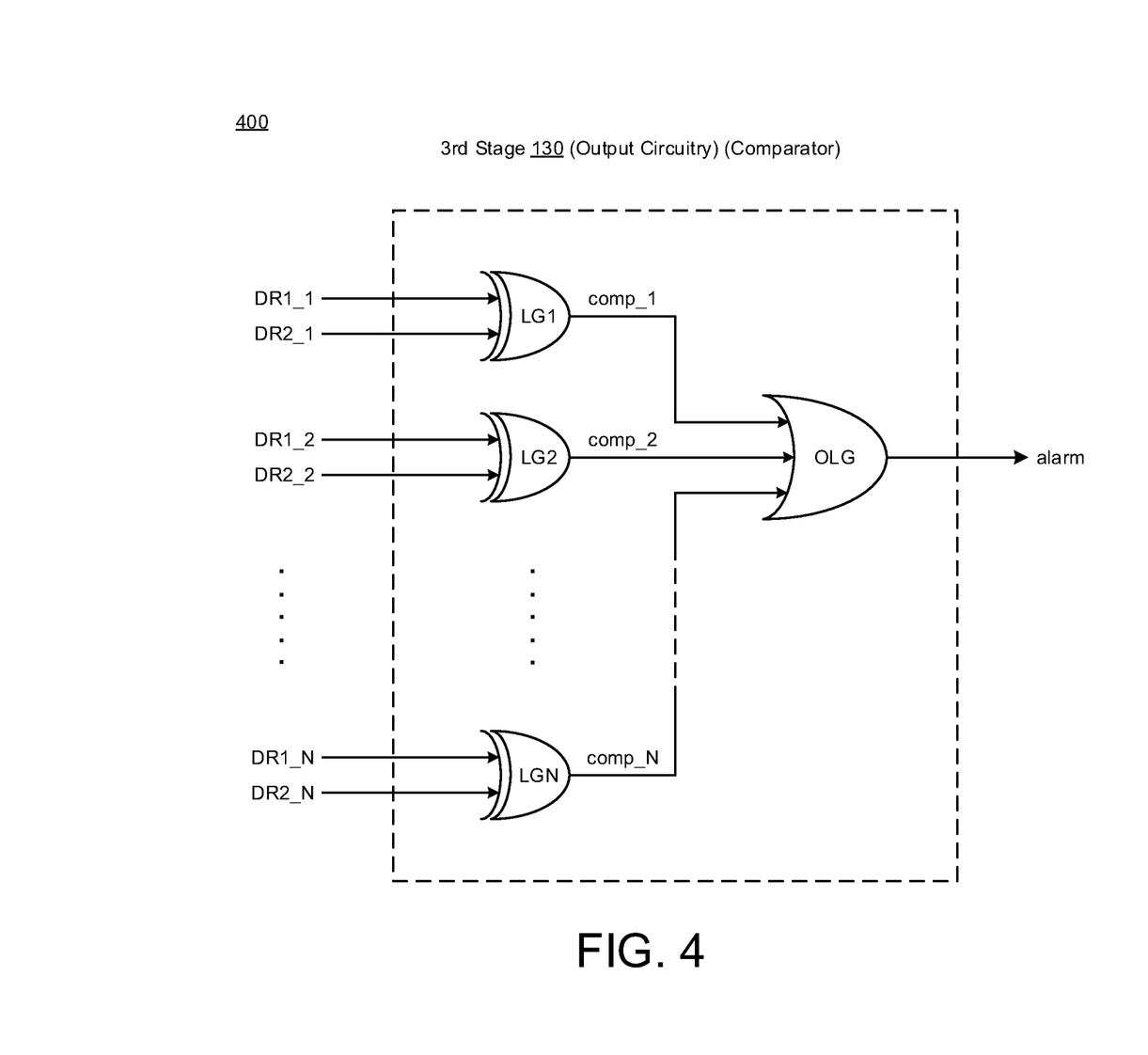
FIG. 4 illustrates a diagram of a third stage of tamper monitoring circuitry in accordance with various implementations described herein.

FIGS. 2-4 illustrate various diagrams 200, 300, 400 of the first stage 110, the second stage 120, and the third stage 130 of the tamper monitoring circuitry 102 shown in FIG. 1 in accordance with various implementations described herein. In this instance, the first stage 110, the second stage 120, and the third stage 130 may be arranged and configured to determine the pulse width of the input clock signal (clk) and to detect edge movement or glitch associated with the pulse width of the input clock signal (clk).

FIG. 2 illustrates a schematic diagram 200 of the first stage 110 of the tamper monitoring circuitry 102 in accordance with implementations described herein. In some implementations, the first stage 110 may be configured as alarm circuitry, and also, the first stage 110 may be configured to include a first chain of registers.

As shown in FIG. 2, the first stage 110 may be configured to receive the input clock signal (clk) and provide alarm chain signals 112 (in FIG. 1) as first delayed signals (ACO_1, ACO_2, ..., ACO_N) based on the input clock signal (clk). In some instances, the first delayed signals (ACO_1, ACO_2, ..., ACO_N) may refer to the first delay chain signals 112 (or alarm chain signals in FIG. 1), and the first stage 110 may include a first chain of registers (reg1[1], reg1[2], ..., reg1[N]) that are configured to receive the input clock signal (clk) and also provide the first delay chain signals as the first delayed signals (ACO_1, ACO_2, ..., ACO_N) based on the input clock signal (clk).

Also, the first stage 110 may include a chain of logic gates (I1/LG1, I2/LG2, ..., IN/LGN) that are coupled to the first chain of registers (reg1[1], reg1[2], ..., reg1[N]), and the chain of logic gates (I1/LG1, I2/LG2, ..., IN/LGN) may be configured to receive the clock signal (clk) and provide a delayed clock signal to a reset pin (R) of each register in the first chain of registers (reg1[1], reg1[2], ..., reg1[N]). Also, each register in the first chain of registers (reg1[1], reg1[2], ..., reg1[N]) may be configured to receive the clock signal (clk) at the reset pin (R), receive a data signal (log_hi) at a data input pin (D), and separately provide a first delay chain signal of the first delay chain signals (ACO_1, ACO_2, ..., ACO_N) based on the clock signal (clk) and the data signal (log_hi). In some instances, receiving the input clock signal (clk) at the reset pins (R) may provide for an asynchronous reflection of the clock pulse width of the input clock signal (clk). Also, the position in the alarm chain where the registers (i.e., flip-flops) have stopped resetting after the rising edge of the clock pulse (clk) may reflect the width of the pulse. For instance, as shown in FIG. 2, the clock signal (clk) may be N=64 bits, and also, the pulse width of the clock signal (clk) may be N/32, which may refer to a 32 bit pulse width.

In some instances, each register in the first chain of registers (reg1[1], reg1[2], ..., reg1[N]) may be configured to operate as a D-flop-flop, and also, the data signal (log_hi) may refer to a logic high signal (i.e., log_hi signal). Also, each register in the first chain of registers (reg1[1], reg1[2], ..., reg1[N]) may provide a corresponding first delayed signal (ACO_1, ACO_2, ..., ACO_N) via a data output pin (Q) based on the clock signal (clk) and the data input signal (log_hi) at the data input pin (D).

In some implementations, the logic gates in the chain of logic gates (I1/LG1, I2/LG2, ..., IN/LGN) may include first logic gates (I1, I2, ..., IN) coupled to second logic gates (LG1, LG2, ..., LGN). In some instances, each logic gate of the first logic gates (I1, I2, ..., IN) may include an inverter (or buffer), and each logic gate of the second logic gates (LG1, LG2, ..., LGN) may include AND gates, or some similar logic gate. However, various other logic gates and configurations thereof may be used.

In some instances, logic gate (I1) may receive the clock signal (clk) and provide a delayed clock signal (clk_dly_1) to the logic gate (LG1), and in this instance, logic gate (LG1) may receive the clock signal (clk) and the delayed clock signal (clk_dly_1) so as to thereby provide a reset signal (rst_1) to the reset pin (R) of register (reg1[1]). In this instance, register (reg1[1]) may be configured to provide delayed signal (ACO_1) based on the data input signal (log_hi), the clock signal (clk), and the reset signal (rst_1).

Also, logic gate (I2) may receive the delayed clock signal (clk_dly_1) from logic gate (I1) and provide another delayed clock signal (clk_dly_2) to the logic gate (LG2), and in this instance, logic gate (LG2) may receive the clock signal (clk) and the delayed clock signal (clk_dly_2) so as to thereby provide another reset signal (rst_2) to the reset pin (R) of register (reg1[2]). In this instance, register (reg1[2]) may be arranged and configured to provide delayed signal (ACO_2) based on the data input signal (log_hi), the clock signal (clk), and the reset signal (rst_2).

Also, logic gate (IN) may receive the delayed clock signal (clk_dly_N) from logic gate (I2, or an intermediate inverter) and provide another delayed clock signal (clk_dly_N) to the logic gate (LGN), and in this instance, logic gate (LGN) may receive the clock signal (clk) and the delayed clock signal (clk_dly_N) so as to thereby provide another reset signal (rst_N) to the reset pin (R) of register (reg1[N]). In this instance, register (reg1[N]) may be arranged and configured to provide delayed signal (ACO_N) based on the data input signal (log_hi), the clock signal (clk), and the reset signal (rst_N).

In some instances, the first chain of registers (reg1[1], reg1[2], ..., reg1[N]) may be arranged and configured to determine the pulse width of the input clock signal (clk) by resetting (or not resetting) individual bits of the registers (reg1[1], reg1[2], ..., reg1[N]) in the delay chain. In this instance, the clock pulse of the input clock signal (clk) may be fed into the delay chain, and then each point in the delay chain is logical ANDed to provide (or not provide) a variable width pulse that drives the asynchronous reset pin (R) of each register (reg1[1], reg1[2], ..., reg1[N]). In this instance, the result refers to a register of N bits (e.g., N=64), where N is determined by the clock period and the delays. The register may be compared cycle-by-cycle to determine if there was any movement or glitch on the clock signal (clk). Various implementations described herein may have numerous advantages, including simplicity of approach, less area is needed, and no need of a ring oscillator or any other similar analog hardware. Another advantage shows that these techniques are reliable when simulated over a large number of operating conditions, such that no false alarms are generated. Also, there are no issues with timing and race conditions, as there is only one clock (e.g., monitored input clock signal) with no asynchronous crossings (as in a ring oscillator circuit). Other advantages also show that these techniques consume much less power than a ring oscillator circuit, because the bits are being set/reset only once per clock period, rather than clocked on multiple edges of a ring oscillator clock per period.

FIG. 3 illustrates a schematic diagram 300 of the second stage 120 of the tamper monitoring circuitry 102 in accordance with implementations described herein. In some implementations, the second stage 120 may be configured as delay chain circuitry, and also, the second stage 120 may also be configured to include multiple delay registers including, e.g., a first delay register 124 and a second delay register 128.

As shown in FIG. 3, the second stage 120 may be configured to receive the first delayed signals (ACO_1, ACO_2, ..., ACO_N) from the first stage 110 (in FIG. 2) and provide delay chain signals 122A (in FIG. 1) as second delayed signals (DR1_1, DR1_2, ..., DR1_N) and delay chain signals 122B (in FIG. 1) as third delayed signals (DR2_1, DR2_2, ..., DR2_N) based on the first delayed signals (ACO_1, ACO_2, ..., ACO_N). The second delayed signals (DR1_1, DR1_2, ..., DR1_N) may refer to the second delay chain signals 122A (in FIG. 1), and the second stage 120 may include a second chain of registers (reg2[1], reg2[2], ..., reg2[N]) that receives the first delayed signals (ACO_1, ACO_2, ..., ACO_N) as the first delay chain signals 112 (in FIG. 1) from the first stage 110 and also provides the second delayed signals (DR1_1, DR1_2, ..., DR1_N) as the second delay chain signals 122A to the third stage 130. The third delayed signals (DR2_1, DR2_2, ..., DR2_N) may refer to the third delay chain signals 122B, and the second stage 120 may include a third chain of registers (reg3[1], reg3[2], ..., reg3[N]) that receives the second delay chain signals (DR1_1, DR1_2, ..., DR1_N) as the second delay chain signals 122A (in FIG. 1) from the second chain of registers (reg2[1], reg2[2], ..., reg2[N]) and provides the third delay chain signals (DR2_1, DR2_2, ..., DR2_N) as the third delay chain signals 122B to the third stage 130.

In reference to the first delay register 124, each register in the second chain of registers (reg2[1], reg2[2], ..., reg2[N]) may be configured to operate as a D-flop-flop, and the data input pin (D) may be configured to receive the corresponding first delayed signal (ACO_1, ACO_2, ..., ACO_N) from the first stage 110. Also, each register in the second chain of registers (reg2[1], reg2[2], ..., reg2[N]) may provide the corresponding second delayed signal (DR1_1, DR1_2, ..., DR1_N) via a data output pin (Q) based on the clock signal (clk) and a corresponding first delayed signal (ACO_1, ACO_2, ..., ACO_N). Also, each register in the second chain of registers (reg2[1], reg2[2], ..., reg2[N]) may provide the corresponding second delayed signal (DR1_1, DR1_2, ..., DR1_N) as an output from each data output pin (Q) to the third stage 130.

In reference to the second delay register 128, each register in the third chain of registers (reg3[1], reg3[2], ..., reg3[N]) may be configured to operate as a D-flop-flop, and the data input pin (D) may be configured to receive a corresponding second delayed signal (DR1_1, DR1_2, ..., DR1_N) from the first delay register 124. Also, each register in the third chain of registers (reg3[1], reg3[2], ..., reg3[N]) may provide the corresponding third delayed signal (DR2_1, DR2_2, ..., DR2_N) via a data output pin (Q) based on the clock signal (clk) and the corresponding second delayed signal (DR1_1, DR1_2, ..., DR1_N). Also, each register in the third chain of registers (reg3[1], reg3[2], ..., reg3[N]) may provide the corresponding third delayed signal (DR2_1, DR2_2, ..., DR2_N) as an output from each data output pin (Q) to the third stage 130.

FIG. 4 illustrates a schematic diagram 400 of the third stage 130 of the tamper monitoring circuitry 102 in accordance with implementations described herein. In some implementations, the third stage 130 may be configured as output circuitry, and also, the third stage 130 may also be configured to operate as a comparator.

As shown in FIG. 4, the third stage 130 may be configured to receive the second delayed signals (DR1_1, DR1_2, ..., DR1_N) from the first delay register 124 of the second stage 120, receive the third delayed signals (DR2_1, DR2_2, ..., DR2_N) from the second delay register 128 of the second stage 120, and provide the alarm control signal (alarm) based on the second delayed signals (DR1_1, DR1_2, ..., DR1_N) and the third delayed signals (DR2_1, DR2_2, ..., DR2_N).

In some instances, the third stage 130 may include multiple logic gates (LG1, LG2, ..., LGN) along with an output logic gate (OLG) that are configured to receive the second delay chain signals (DR1_1, DR1_2, ..., DR1_N) from the second chain of registers (reg2[1], reg2[2], ..., reg2[N]), receive the third delay chain signals (DR2_1, DR2_2, ..., DR2_N) from the third chain of registers (reg3[1], reg3[2], ..., reg3[N]), and provide the alarm control signal (alarm) based on the second delay chain signals (DR1_1, DR1_2, ..., DR1_N) and the third delay chain signals (DR2_1, DR2_2, ..., DR2_N).

In reference to the third stage 130, the multiple logic gates (LG1, LG2, ..., LGN) may include first logic gates, such as, e.g., XOR gates, or some other similar logic gates. Also, in this instance, the output logic gate (OLG) may include a second logic gate, such as, e.g., an OR gate, or some other similar logic gate. In some implementations, the logic gate (LG1) may receive multiple delay chain signals (DR1_1, DR2_1) and provide a first comparator signal (comp_1) to the output logic gate (OLG) based on the multiple delay chain signals (DR1_1, DR2_1). Also, the logic gate (LG2) may receive delay chain signals (DR1_2, DR2_2) and provide a second comparator signal (comp_2) to the output logic gate (OLG) based on the delay chain signals (DR1_2, DR2_2). Also, the logic gate (LGN) may receive delay chain signals (DR1_N, DR2_N) and provide another comparator signal (comp_N) to the output logic gate (OLG) based on the delay chain signals (DR1_N, DR2_N). Further, in this instance, the output logic gate (OLG) may receive the multiple comparator signals (comp_1, comp_2, . . . , comp_N) and provide the alarm control signal (alarm) based on the comparator signals (comp_1, comp_2, . . . , comp_N).

Figure 5:
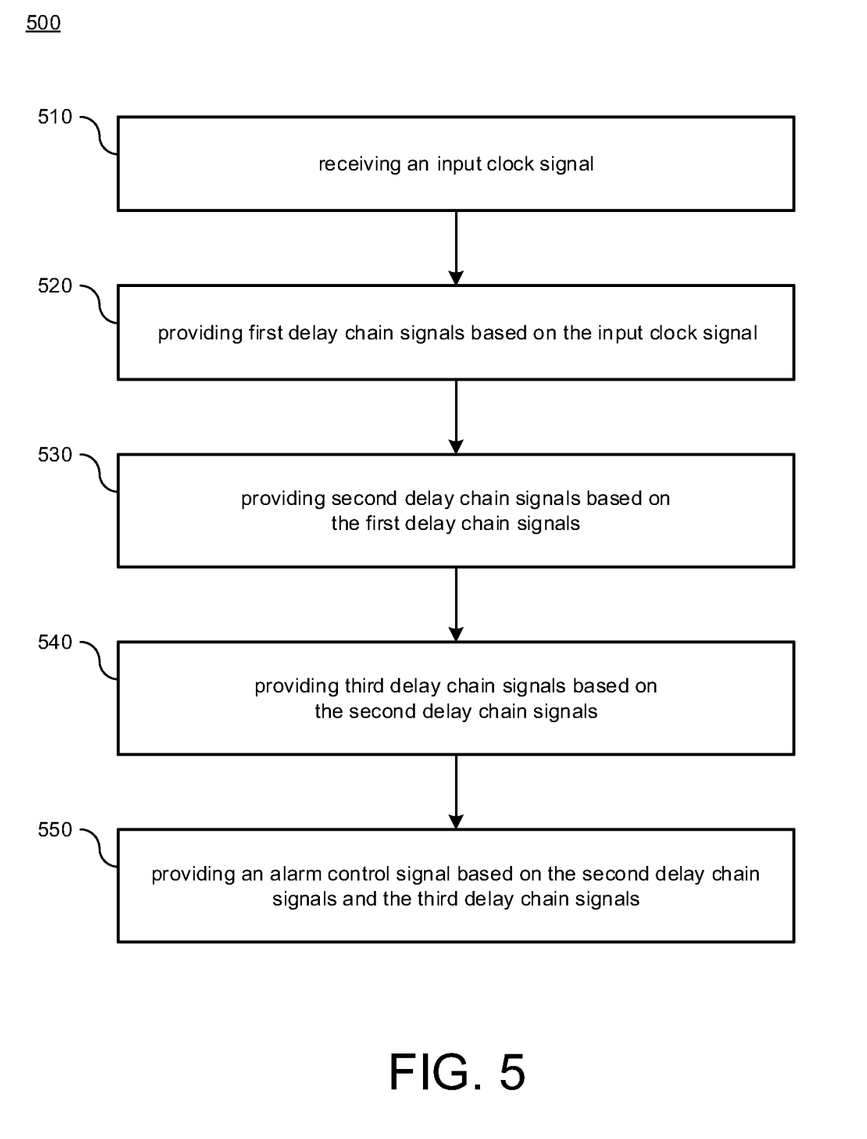
FIG. 5 illustrates a process flow diagram of a method for performing tamper monitoring techniques in accordance with implementations described herein.

FIG. 5 illustrates a process diagram of a method 500 for performing tamper monitoring techniques in accordance with implementations described herein.

It should be understood that even though method 500 may indicate a particular order of operation execution, in some cases, portions of operations may be executed in a different order, and on different systems. Also, additional operations and/or steps may be added to and/or omitted from method 500. In various instances, method 500 may be implemented in hardware and/or software. If implemented in hardware, method 500 may be implemented with various components and/or circuitry, as described in reference to FIGS. 1-4. If implemented in software, method 500 may be implemented with various programs and/or software instruction processes that are configured for the various tamper monitoring schemes and techniques, as described herein. In addition, if implemented in software, various instructions related to implementing method 500 may be stored and/or recorded in memory and/or a database. In other instances, a computer or various other types of computing devices having at least one processor and memory may be configured to perform the various operations and/or steps of method 500.

As shown in FIG. 5, at block 510, method 500 may be configured to receive an input clock signal, e.g., from an external source, and at block 520, method 500 may be configured to provide first delay chain signals based on the input clock signal. In some implementations, method 500 may be configured to use a first chain of registers to receive the input clock signal at reset pins and provide the first delay chain signals based on the input clock signal. Also, receiving the input clock signal at the reset pins may provide for an asynchronous reflection of a clock pulse width of the input clock signal.

In block 530, method 500 may be configured to provide second delay chain signals based on the first delay chain signals. In some implementations, method 500 may be configured to use a second chain of registers to receive the first delay chain signals from the first chain of registers and also provide the second delay chain signals based on the first delay chain signals.

In block 540, method 500 may be configured to provide third delay chain signals based on the second delay chain signals. In some implementations, method 500 may be configured to use a third chain of registers to receive the second delay chain signals from the second chain of registers and also provide the third delay chain signals based on the second delay chain signals.

In block 550, method 500 may be configured to provide an alarm control signal based on the second delay chain signals and/or the third delay chain signals. In some implementations, method 500 may be configured to use output circuitry with one or more logic gates to receive the second delay chain signals, receive the third delay chain signals, and provide the alarm control signal based on the second delay chain signals and/or the third delay chain signals.

It should be intended that the subject matter of the claims not be limited to the implementations and illustrations provided herein, but include modified forms of those implementations including portions of implementations and combinations of elements of different implementations in accordance with the claims. It should be appreciated that in the development of any such implementation, as in any engineering or design project, numerous implementation-specific decisions should be made to achieve developers' specific goals, such as compliance with system-related and business related constraints, which may vary from one implementation to another. Moreover, it should be appreciated that such a development effort may be complex and time consuming, but would nevertheless be a routine undertaking of design, fabrication, and manufacture for those of ordinary skill having benefit of this disclosure.

Described herein are various implementations of a device. The device may include alarm circuitry that receives a clock signal and provides alarm chain signals based on the clock signal. The device may include delay chain circuitry that receives the alarm chain signals from the alarm circuitry and provides delay chain signals. The device may include output circuitry that receives the delay chain signals from the delay chain circuitry and provides an alarm control signal based on the delay chain signals.

Described herein are various implementations of a tamper monitoring circuit. The tamper monitoring circuit may include a first stage that receives an input clock signal and provides first delayed signals based on the input clock signal. The tamper monitoring circuit may include a second stage that receives the first delayed signals from the first stage and provides second delayed signals and third delayed signals based on the first delayed signals. The tamper monitoring circuit may include a third stage that receives the second delayed signals from the second stage, receives the third delayed signals from the second stage, and provides an alarm control signal based on the second delayed signals and the third delayed signals.

Described herein are various implementations of a method. The method may include receiving an input clock signal, providing first delay chain signals based on the input clock signal, and providing second delay chain signals based on the first delay chain signals. The method may include providing third delay chain signals based on the second delay chain signals. The method may include providing an alarm control signal based on the second delay chain signals and the third delay chain signals.

Reference has been made in detail to various implementations, examples of which are illustrated in the accompanying drawings and figures. In the following detailed description, numerous specific details are set forth to provide a thorough understanding of the disclosure provided herein. However, the disclosure provided herein may be practiced without these specific details. In some other instances, well-known methods, procedures, components, circuits and networks have not been described in detail so as not to unnecessarily obscure details of the embodiments.

It should also be understood that, although the terms first, second, etc. may be used herein to describe various elements, these elements should not be limited by these terms. These terms are only used to distinguish one element from another. For example, a first element could be termed a second element, and, similarly, a second element could be termed a first element. The first element and the second element are both elements, respectively, but they are not to be considered the same element.

The terminology used in the description of the disclosure provided herein is for the purpose of describing particular implementations and is not intended to limit the disclosure provided herein. As used in the description of the disclosure provided herein and appended claims, the singular forms "a," "an," and "the" are intended to include the plural forms as well, unless the context clearly indicates otherwise. The term "and/or" as used herein refers to and encompasses any and all possible combinations of one or more of the associated listed items. The terms "includes," "including," "comprises," and/or "comprising," when used in this specification, specify a presence of stated features, integers, steps, operations, elements, and/or components, but do not preclude the presence or addition of one or more other features, integers, steps, operations, elements, components and/or groups thereof.

As used herein, the term "if" may be construed to mean "when" or "upon" or "in response to determining" or "in response to detecting," depending on the context. Similarly, the phrase "if it is determined" or "if [a stated condition or event] is detected" may be construed to mean "upon determining" or "in response to determining" or "upon detecting [the stated condition or event]" or "in response to detecting [the stated condition or event]," depending on the context. The terms "up" and "down"; "upper" and "lower"; "upwardly" and "downwardly"; "below" and "above"; and other similar terms indicating relative positions above or below a given point or element may be used in connection with some implementations of various technologies described herein.

While the foregoing is directed to implementations of various techniques described herein, other and further implementations may be devised in accordance with the disclosure herein, which may be determined by the claims that follow.

Although the subject matter has been described in language specific to structural features and/or methodological acts, it is to be understood that the subject matter defined in the appended claims is not necessarily limited to the specific features or acts described above. Rather, the specific features and acts described above are disclosed as example forms of implementing the claims.

What is claimed is:

1. A device, comprising:
    alarm circuitry that receives a clock signal and provides alarm chain signals based on the clock signal;
    delay chain circuitry that receives the alarm chain signals from the alarm circuitry and provides delay chain signals; and
    output circuitry that receives the delay chain signals from the delay chain circuitry and provides an alarm control signal based on the delay chain signals.

2. The device of claim 1, wherein the alarm chain signals refer to first delay chain signals, and wherein the alarm circuitry includes a first chain of registers that is configured to receive the clock signal and provide the first delay chain signals based on the clock signal.

3. The device of claim 2, wherein the alarm circuitry includes a chain of logic gates that are coupled to the first chain of registers, and wherein the chain of logic gates receives the clock signal and provides a delayed clock signal to a reset pin of each register in the first chain of registers.

4. The device of claim 2, wherein each register in the first chain of registers receives the clock signal at a reset pin, receives a data signal at a data input pin, and separately provides a first delay chain signal of the first delay chain signals based on the clock signal and the data signal.

5. The device of claim 3, wherein each register in the first chain of registers is configured to operate as a D-flop-flop, wherein the clock signal refers to a system clock, and wherein the data signal refers to a logic high signal.

6. The device of claim 2, wherein the delay chain signals refer to second delay chain signals and third delay chain signals, and wherein the delay chain circuitry includes a second chain of registers coupled to a third chain of registers.

7. The device of claim 6, wherein the second chain of registers is configured to receive the first delay chain signals from the alarm circuitry and provide the second delay chain signals of the delay chain signals.

8. The device of claim 7, wherein the third chain of registers is configured to receive the second delay chain signals from the second chain of registers and provide third delay chain signals of the delay chain signals.

9. The device of claim 8, wherein the output circuitry includes multiple logic gates that are configured to receive the second delay chain signals from the second chain of registers, receive the third delay chain signals from the third chain of registers, and provide the alarm control signal based on the second delay chain signals and the third delay chain signals.

10. The device of claim 1, wherein the device is configured to determine a pulse width of the clock signal and detect edge movement or glitch associated with the pulse width of the clock signal.

11. A tamper monitoring circuit, comprising:
    a first stage that receives an input clock signal and provides first delayed signals based on the input clock signal;
    a second stage that receives the first delayed signals from the first stage and provides second delayed signals and third delayed signals based on the first delayed signals; and
    a third stage that receives the second delayed signals from the second stage, receives the third delayed signals from the second stage, and provides an alarm control signal based on the second delayed signals and the third delayed signals.

12. The circuit of claim 11, wherein the first delayed signals are first delay chain signals, and wherein the first stage comprises a first chain of registers that are configured to receive the input clock signal and provide the first delay chain signals based on the input clock signal.

13. The circuit of claim 12, wherein the first stage includes a chain of logic gates that are coupled to the first chain of registers, and wherein the chain of logic gates receives the clock signal and provides a delayed clock signal to a reset pin of each register in the first chain of registers.

14. The circuit of claim 12, wherein each register in the first chain of registers receives the clock signal at a reset pin, receives a data signal at a data input pin, and separately provides a first delay chain signal of the first delay chain signals based on the clock signal and the data signal.

15. The circuit of claim 12, wherein the second delayed signals refer to second delay chain signals, and wherein the second stage includes a second chain of registers that receives the first delay chain signals from the first stage and provides the second delay chain signals to the third stage.

16. The circuit of claim 15, wherein the third delayed signals refer to third delay chain signals, and wherein the second stage includes a third chain of registers that receives the second delay chain signals from the second chain of registers and provides the third delay chain signals to the third stage.

17. The circuit of claim 16, wherein the third stage includes multiple logic gates that are configured to receive the second delay chain signals from the second chain of registers, receive the third delay chain signals from the third chain of registers, and provide the alarm control signal based on the second delay chain signals and the third delay chain signals.

18. The circuit of claim 11, wherein the first stage, the second stage and the third stage are arranged and configured to determine a pulse width of the input clock signal and detect edge movement or glitch associated with the pulse width of the input clock signal.

19. A method, comprising:

receiving an input clock signal;

providing first delay chain signals based on the input clock signal;

providing second delay chain signals based on the first delay chain signals;

providing third delay chain signals based on the second delay chain signals; and providing an alarm control signal based on the second delay chain signals and the third delay chain signals.

20. A method of claim 19, further comprising:

using a first chain of registers to receive the input clock signal at reset pins and provide the first delay chain signals based on the input clock signal, wherein receiving the input clock signal at the reset pins provides for an asynchronous reflection of a clock pulse width of the input clock signal;

using a second chain of registers to receive the first delay chain signals from the first chain of registers and provide the second delay chain signals based on the first delay chain signals;

using a third chain of registers to receive the second delay chain signals from the second chain of registers and provide the third delay chain signals based on the second delay chain signals; and using output circuitry with logic gates to receive the second delay chain signals, receive the third delay chain signals, and provide the alarm control signal based on the second delay chain signals and the third delay chain signals.

* * * * *